United States Patent

Nishiguchi

Patent Number: 5,384,000
Date of Patent: * Jan. 24, 1995

[54] SEMICONDUCTOR CHIP MOUNTING METHOD AND APPARATUS

[75] Inventor: Masanori Nishiguchi, Yokohama, Japan

[73] Assignee: Sumitomo Electric Industries, Ltd., Osaka, Japan

[*] Notice: The portion of the term of this patent subsequent to Jun. 28, 2011 has been disclaimed.

[21] Appl. No.: 205,416

[22] Filed: Mar. 3, 1994

Related U.S. Application Data

[63] Continuation of Ser. No. 56,777, May 4, 1993, Pat. No. 5,324,381.

[30] Foreign Application Priority Data

| | | | |
|---|---|---|---|
| May 6, 1992 | [JP] | Japan | 4-113569 |
| May 15, 1992 | [JP] | Japan | 4-123758 |
| May 15, 1992 | [JP] | Japan | 4-123761 |

[51] Int. Cl.6 ............................................. H01L 21/60
[52] U.S. Cl. ............................ 156/297; 156/360; 356/388; 356/390; 356/395; 356/398; 356/399; 437/7; 437/8; 437/209
[58] Field of Search .................. 156/297, 360; 437/7, 437/8, 209; 356/388, 390, 395, 398, 399

[56] References Cited

U.S. PATENT DOCUMENTS

| | | | |
|---|---|---|---|
| 3,684,384 | 8/1972 | Hojo et al. | 356/399 |
| 4,833,621 | 5/1989 | Umatate | 437/8 |
| 4,902,631 | 2/1990 | Downey et al. | 437/8 |
| 5,262,355 | 11/1993 | Nishiguchi et al. | 437/209 |

FOREIGN PATENT DOCUMENTS

| | | | |
|---|---|---|---|
| 0462596 | 12/1991 | European Pat. Off. | |
| 218516 | 12/1984 | Japan | 356/399 |

OTHER PUBLICATIONS

Heng et al., Cooling MCMs With Pin Fin Heat Sinks, Electronic Packaging and Production, Oct. 1991, pp. 54–57.

Zimmerman, Protecting Multichip Modules With Molded Packaging, Electronic Packaging & Production, Oct., 1991, pp. 48–51.

Markstein, Multichip Modules Pursue Wafer Scale Performance, Electronic Packaging & Production, Oct., 1991, pp. 40–45.

*Primary Examiner*—Caleb Weston
*Attorney, Agent, or Firm*—Cushman, Darby & Cushman

[57] ABSTRACT

The three-dimensional shape of the surface of a board (12) is measured, and the parallel degree between the board (12) and a semiconductor chip (10) is adjusted on the basis of the measurement result. A board mounting means (13) and a semiconductor chip holding means (11) are moved close to each other, and the semiconductor chip (10) is mounted on the board (12).

28 Claims, 19 Drawing Sheets

SEMICONDUCTOR CHIP MOUNTING METHOD AND APPARATUS

This is a continuation of application Ser. No. 08/056,777, filed May 4, 1993, U.S. Pat. No. 5,324,381.

BACKGROUND OF THE INVENTION

1. Field of the Invention

The present invention relates to a method and apparatus for mounting a large semiconductor chip, e.g., an Si-LSI, a GaAs-LSI, and a liquid crystal display (LCD).

2. Related Background Art

A flip chip is mounted by connecting all bumps provided to a semiconductor chip to pads on a board. For this purpose, a technique for maintaining the parallel degree between the semiconductor chip and the board is very important. A conventional technique for maintaining the parallel degree between the semiconductor chip and the board in this manner uses, e.g., an optical probe. According to this method, probe light beams are radiated on a semiconductor chip and a board, and light beams reflected by the semiconductor chip and the board are measured, thereby adjusting the parallel degree between them.

Recently, however, as the size of the semiconductor chip and board is increased, it has become difficult to maintain the parallel degree between a semiconductor chip and a board by the conventional adjusting method. This is supposed to be caused by the following two factors. First, according to the conventional method, although a deviation of parallel degree is detected from a deviation in angle, an error in this detecting method has become large. More specifically, even if a deviation in angle at a certain measurement point is very small, as the size of a semiconductor chip and board is increased, it appears as a very large deviation in angle at a location remote from the measurement point. Second, when the board is made of ceramic, a warp or undulation is present in the board due to the characteristics of a ceramic. As the size of the board is increased, these warp and undulation become unneglectable.

It is an object of the present invention to provide semiconductor chip mounting method and apparatus capable of sufficiently maintaining the parallel degree between a semiconductor chip and a board even when the size of the semiconductor chip and board is increased, thereby maintaining a high mounting yield.

SUMMARY OF THE INVENTION

According to a semiconductor chip mounting method of the first aspect of the present invention, the three-dimensional shape of the surface of a board is measured, and the parallel degree between the board and a semiconductor chip is adjusted on the basis of the measurement result. Board mounting means and semiconductor chip holding means are moved close to each other, and the semiconductor chip is mounted on the board.

A semiconductor chip mounting apparatus according to the first aspect of the present invention comprises measuring means for measuring the three-dimensional shape of the surface of a board, adjusting means for adjusting the parallel degree between the board and the semiconductor chip on the basis of the measurement result of the measuring means, and mounting means for moving the board mounting means and the semiconductor chip holding means close to each other and mounting the semiconductor chip on the board. The parallel degree between the board and the semiconductor chip is adjusted on the basis of the measurement result of the three-dimensional shape of the surface of the board which is measured by the measuring means. After adjustment, the board mounting means and the semiconductor chip holding means are moved close to each other by the mounting means, and the semiconductor chip is mounted on the board.

According to a semiconductor chip mounting method of the second aspect of the present invention, the relative angles between the board and the semiconductor chip are measured at a plurality of measurement points. The parallel degree between the board and the semiconductor chip is adjusted on the basis of the measurement result, thereafter the board mounting means and the semiconductor chip holding means are moved close to each other, and the semiconductor chip is mounted on the board.

A semiconductor chip mounting apparatus according to the second aspect of the present invention comprises measuring means for measuring the relative angles between a board and a semiconductor chip at a plurality of measurement points, adjusting means for adjusting the parallel degree between the board and the semiconductor chip on the basis of the measurement result of the measuring means, and mounting means for moving the board mounting means and the semiconductor chip holding means close to each other and mounting the semiconductor chip on the board. The parallel degree between the board and the semiconductor chip is adjusted by the adjusting means on the basis of the measurement result of the relative angles between the board and the semiconductor chip which are measured by the measuring means. After adjustment, the board mounting means and the semiconductor chip holding means are moved close to each other by the mounting means, and the semiconductor chip is mounted on the board.

DESCRIPTION OF THE PREFERRED EMBODIMENTS

The preferred embodiments of the present invention will be described with reference to the accompanying drawings.

Figure 1:
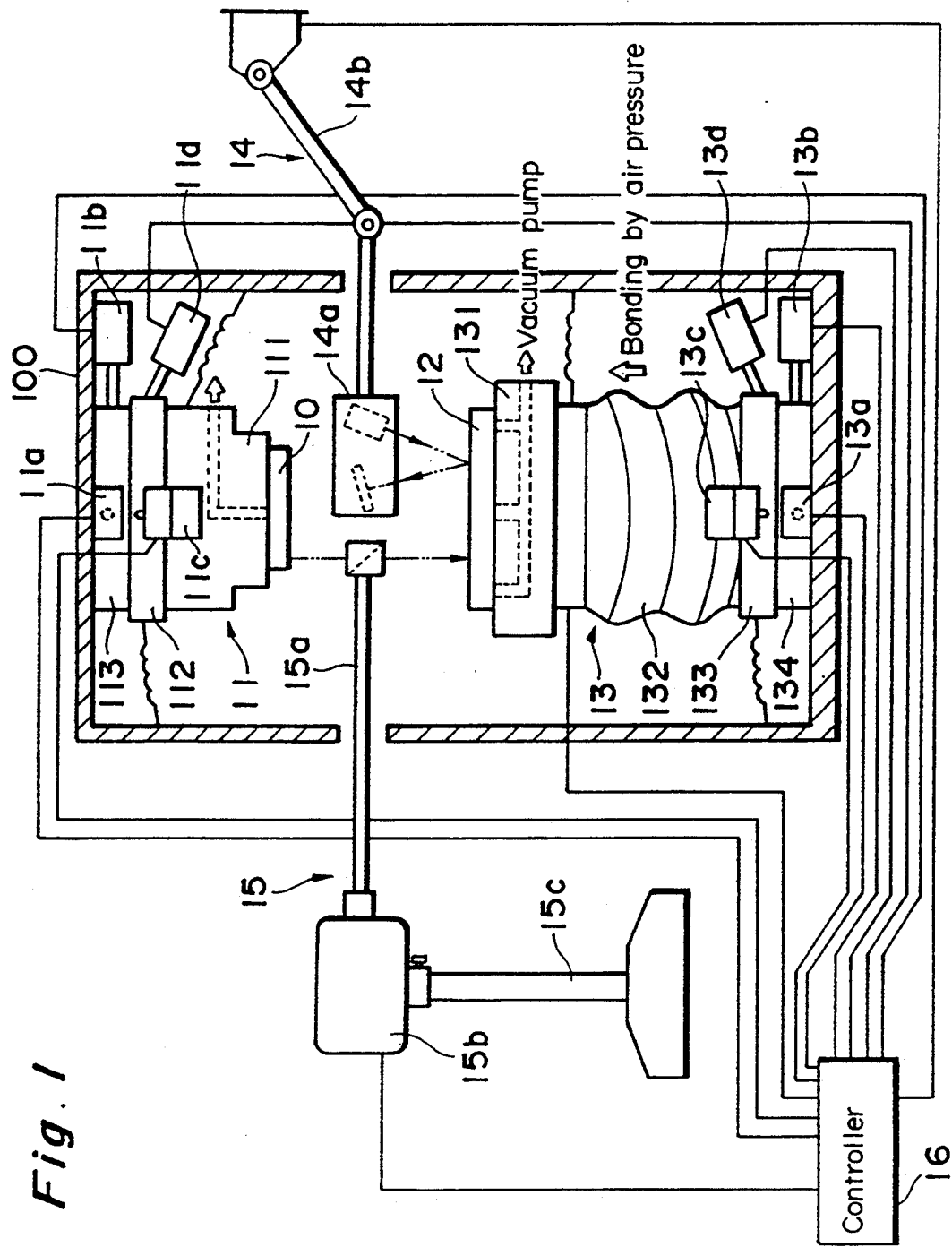
FIG. 1 is a schematic diagram showing the arrangement of a semiconductor chip mounting apparatus according to the first embodiment of the present invention.

FIG. 1 is a schematic diagram showing the arrangement of a semiconductor chip mounting apparatus according to the first embodiment of the present invention.

Referring to FIG. 1, the semiconductor chip mounting apparatus of the first embodiment has a semiconductor chip mount section 11 having a lower surface to which a semiconductor chip 10 is mounted by vacuum chucking, and a board mount section 13 having an upper surface to which a board 12 is mounted by vacuum chucking. The semiconductor chip mount section 11 and the board mount section 13 are fixed to the upper and lower portions, respectively, of a frame body 100. A distance sensor unit 14 for measuring the three-dimensional shape of the surface of the board 12, and a parallel degree measuring unit 15 for measuring the parallel degree between the semiconductor chip 10 and the board 12 are provided between the semiconductor chip mount section 11 and the board mount section 13.

The distance sensor unit 14 has a sensor portion 14a for measuring the distance to the surface of the board 12, and an arm portion 14b for moving the sensor portion 14a horizontally in the two-dimensional direction. The parallel degree measuring unit 15 has an optical probe 15a for radiating probe light beams to the semiconductor chip 10 and the board 12, a measuring portion 15b for measuring the reflection angles of the probe light beams reflected by the semiconductor chip 10 and the board 12, and a support 15c for supporting the optical probe 15a and the measuring portion 15b.

The semiconductor chip mount section 11 has a chuck block 111 for chucking the semiconductor chip 10, a swingable stage 112 to which the chuck block 111 is fixed, and a horizontally movable stage 113 to which the swingable stage 112 is fixed and which is movable horizontally in the two-dimensional direction. Actuators 11a and 11b for performing adjustment in directions parallel to the upper surface of the semiconductor chip 10 are provided on the two orthogonal surfaces of side surface portions of the horizontally movable stage 113. Actuators 11c and 11d for performing adjustment of the inclination of the semiconductor chip 10 are provided on the two orthogonal surfaces of side surface portions of the swingable stage 112.

The board mount section 13 has a chuck block 131 for chucking the board 12, a bonding mechanism portion 132 to which the chuck block 131 is fixed and which vertically moves the chuck block 131, a swingable stage 133 to which the bonding mechanism portion 132 is fixed, and a horizontally movable stage 134 to which the swingable stage 133 is fixed and which is movable horizontally in the two-dimensional direction. Actuators 13a and 13b for performing adjustment in directions parallel to the upper surface of the board 12 are provided on the two orthogonal surfaces of side surface portions of the horizontally movable stage 134. Actuators 13c and 13d for performing adjustment of the inclination of the board 12 are provided on the two orthogonal surfaces of side surface portions of the swingable stage 133.

The semiconductor chip mounting apparatus also has a controller 16 for adjusting the parallel degree between the semiconductor chip 10 and the board 12. The controller 16 receives measurement result data supplied from the distance sensor unit 14 and the optical probe 15a, and outputs necessary commands to the actuators 11a to 11d and 13a to 13d based on the result data.

Figure 2:
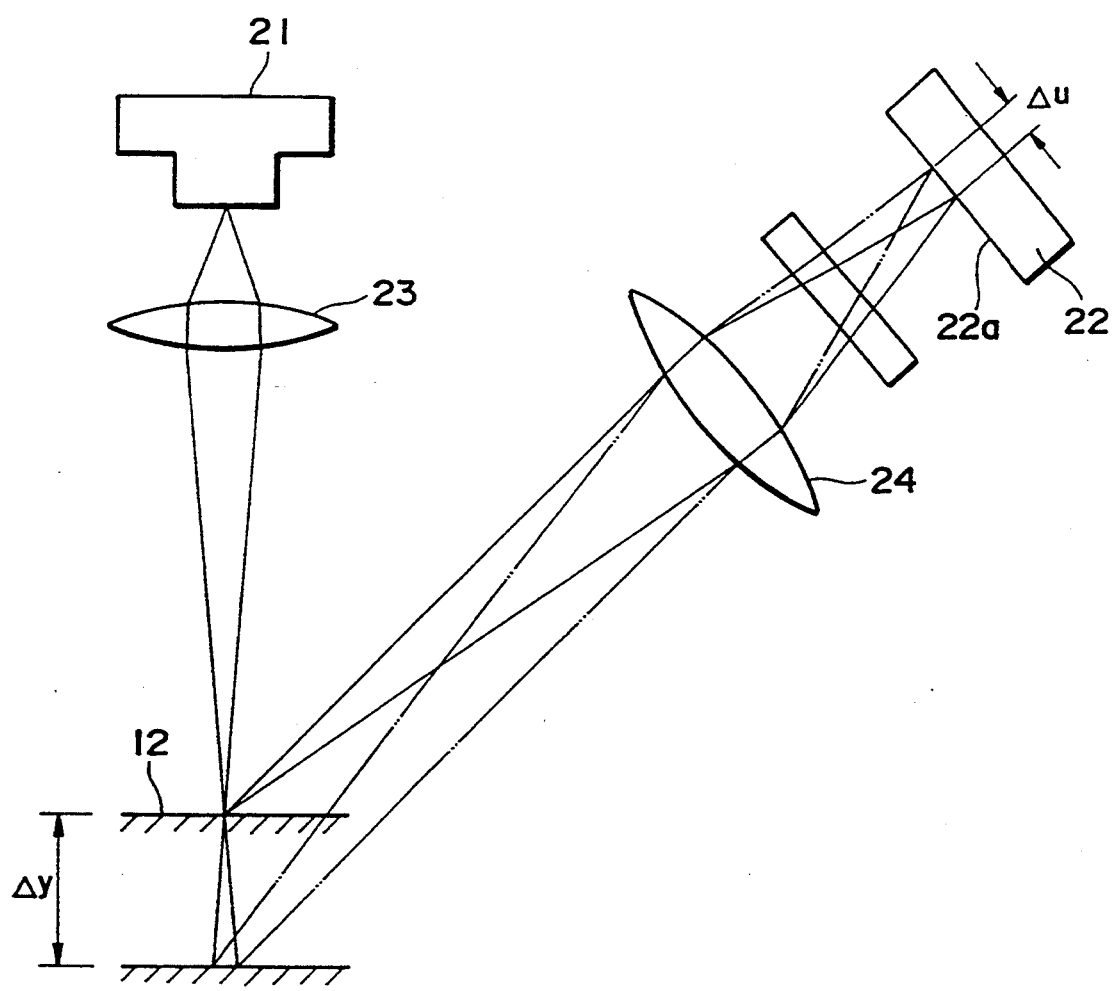
FIG. 2 is a schematic view showing the measuring principle of a distance sensor unit.

The distance sensor unit 14 performs measurement by using the principle of triangulation. FIG. 2 shows the measuring principle of the distance sensor unit 14. In the distance sensor unit 14, a spot light beam of a semiconductor laser 21 is radiated on the surface of the board 12, and a light beam reflected by the surface of the board 12 forms an image on an observation surface 22a of a semiconductor position detector 22. The position of the spot image formed on the observation surface 22a is proportional to the distance between the semiconductor laser 21 and the surface of the board 12. More specifically, when the distance between the semiconductor laser 21 and the surface of the board 12 is changed by $\Delta y$, the position of the spot image on the observation surface 22a is moved by $\Delta \mu$. Accordingly, the three-dimensional shape of the surface of the board 12 can be obtained by scanning the surface of the board 12 with the spot light beam from the distance sensor unit 14 and measuring the change in position of the spot image formed by the unevenness of the surface of the board 12 by the semiconductor position detector 22.

Figure 3:
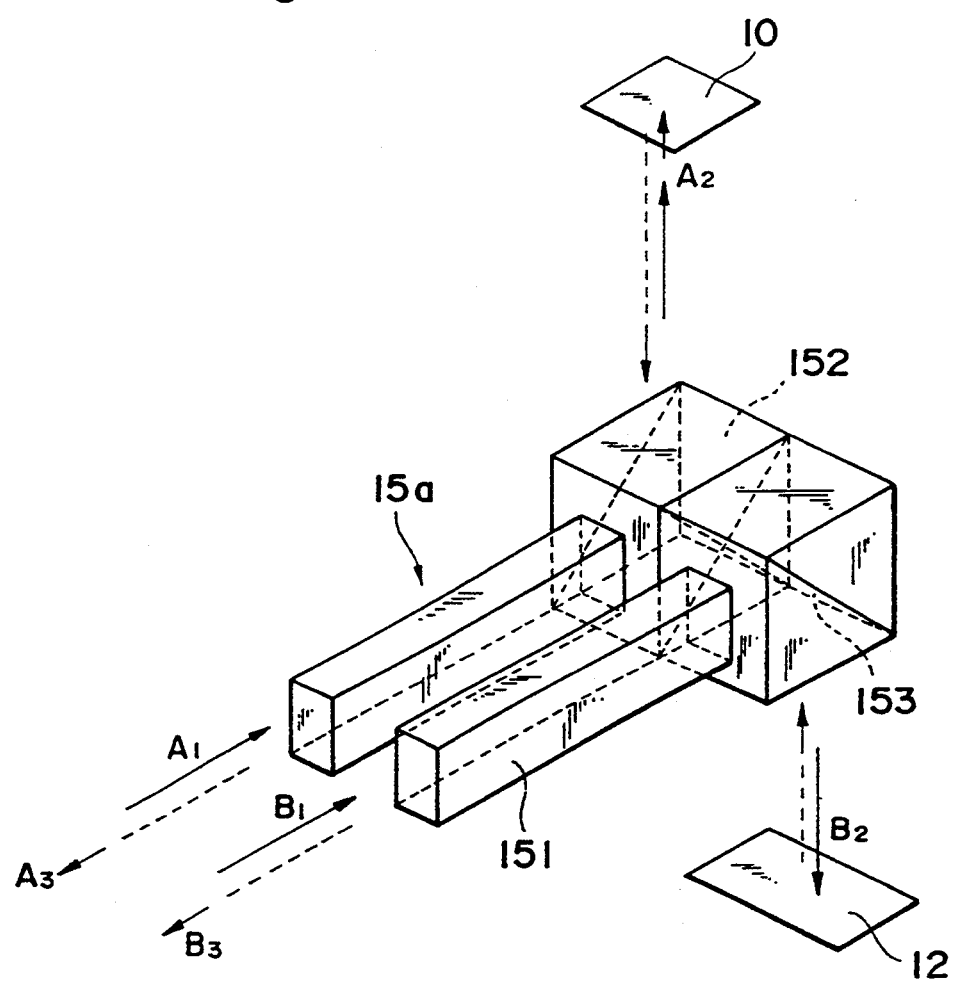
FIG. 3 is a perspective view showing the measuring principle of an optical probe unit.

The measuring principle of the optical probe 15a will be described with reference to FIG. 3. Referring to FIG. 3, incident light beams $A_1$ and $B_1$ incident parallel to each other from a light source pass through light guides 151, are reflected by reflecting mirrors 152 and 153, and are radiated on the lower and upper surfaces, respectively, of the semiconductor chip 10 and the board 12 as radiation light beams $A_2$ and $B_2$. The radiation light beams $A_2$ and $B_2$ are reflected by the lower and upper surfaces, respectively, of the semiconductor chip 10 and the board 12 and are outputted from them through the reflecting mirrors 152 and 153 as exit light beams $A_3$ and $B_3$. When the exit positions of the exit light beams $A_3$ and $B_3$ are measured by the measuring portion 15b, a deviation in angle of the lower and upper surfaces, respectively, of the semiconductor chip 10 and the board 12 can be determined. The measuring portion 15b has, e.g., a semiconductor position detector.

Figure 4:
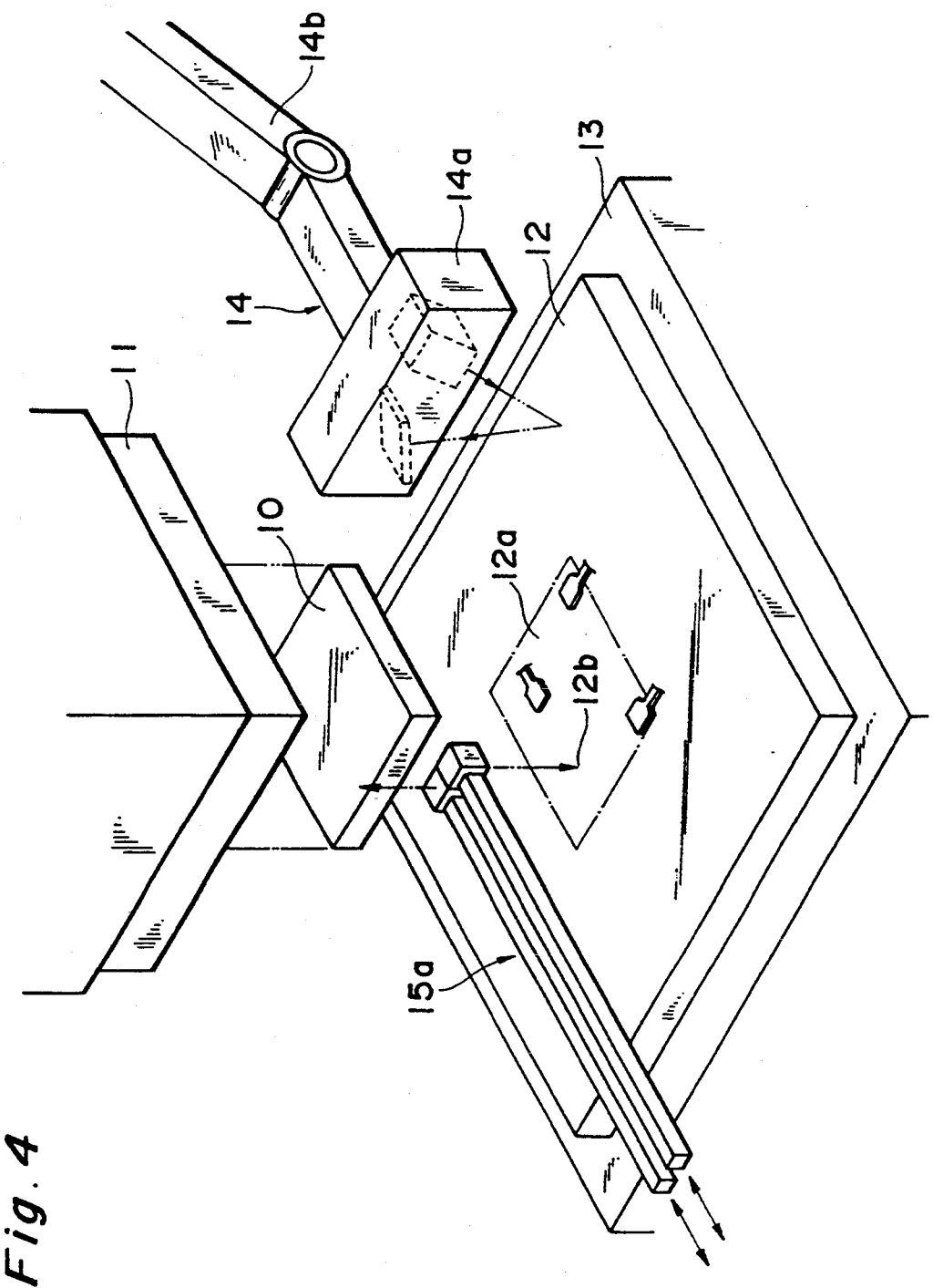
FIG. 4 is a perspective view showing a mounting method using the semiconductor chip mounting apparatus.
Figure 5:
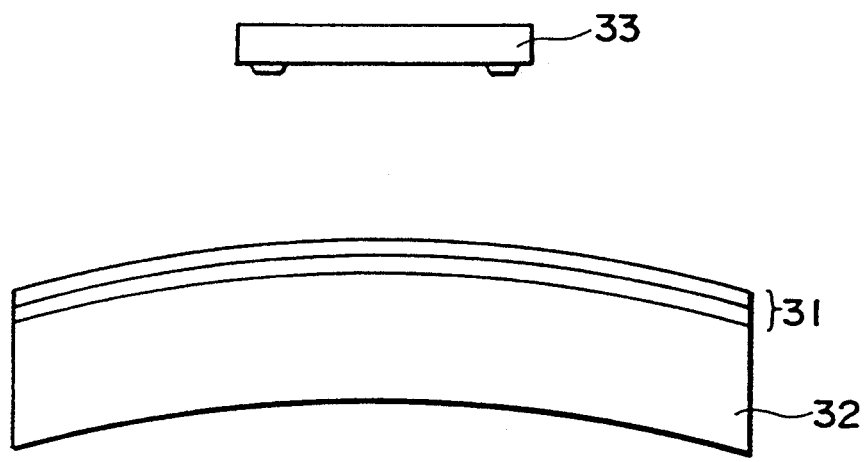
FIGS. 5 and 6 are sectional views showing ceramic boards having a warp and an undulation, respectively.
Figure 6:
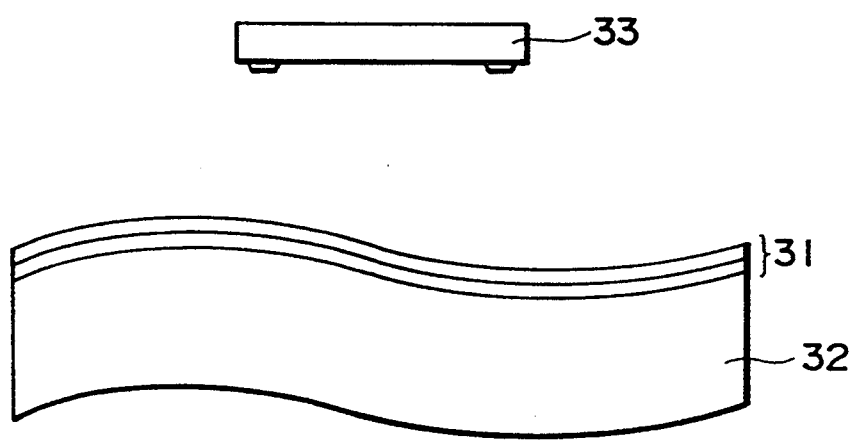

A mounting method using this semiconductor chip mounting apparatus will be described with reference to the perspective view of FIG. 4. The semiconductor chip 10 is mounted on the chuck block 111 of the semiconductor chip mount section 11 by chucking, and the board 12 is mounted on the chuck block 131 of the board mount section 13 by chucking. The surface of the board 12 is scanned by using the distance sensor unit 14, thereby measuring the three-dimensional shape of the surface of the board 12. With this measurement, whether the surface of the board 12 is flat can be confirmed. This flatness confirmation is needed before mounting due to the following reasons. First, as the size of the semiconductor chip 10 and the board 12 is increased, it has become difficult to maintain the parallel degree of the entire surface of the board 12. Second, when a ceramic board is used as the board 12, the board 12 has a warp or undulation due to its characteristics. Especially, as shown in FIGS. 5 and 6, when an $Al_2O_3$ or AlN ceramic board 32 having a surface on which a PI(polyimide)/Cu multilayer thin film 31 or the like is formed is used, the warp and undulation become apparent.

Figure 7:
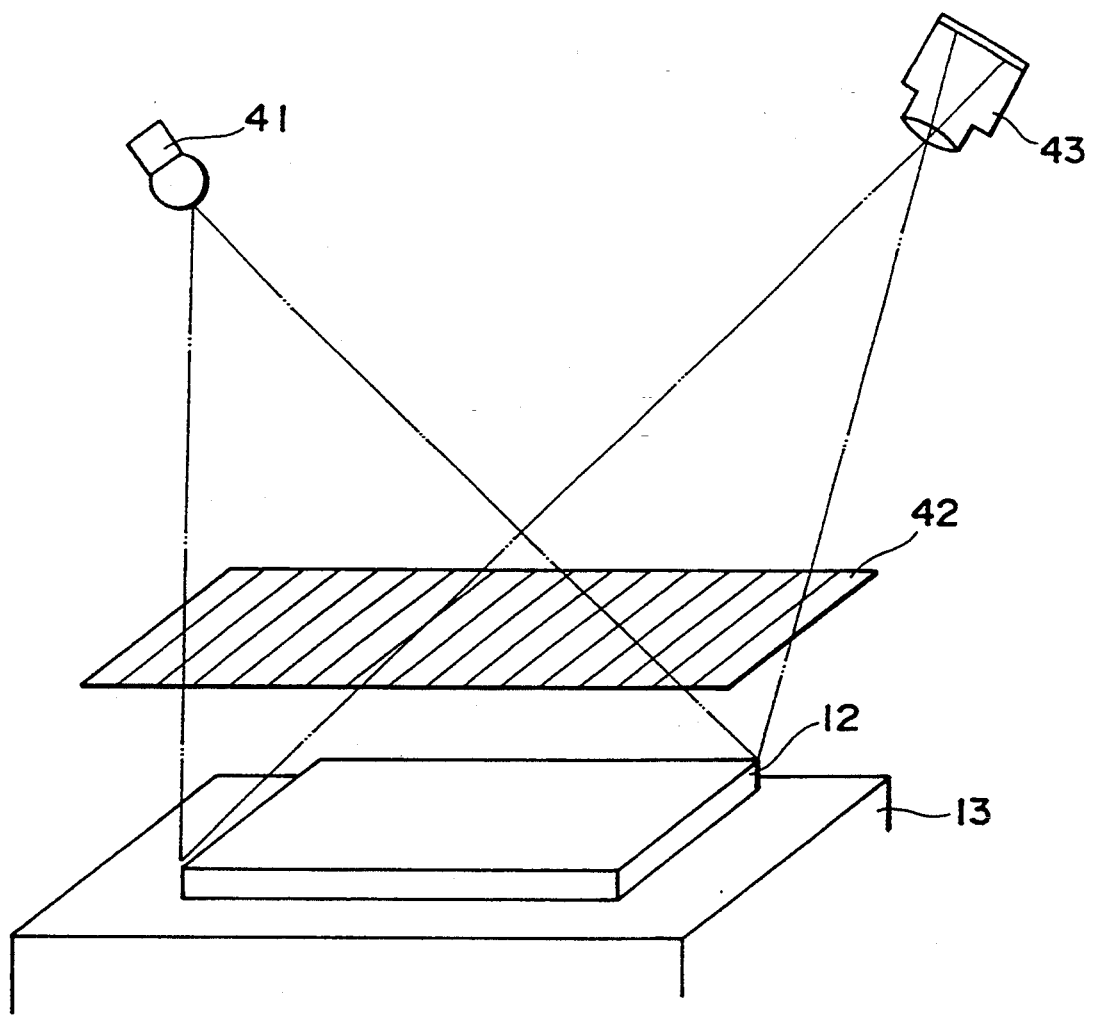
FIG. 7 is a perspective view showing a method of measuring a three-dimensional shape.

The three-dimensional shape of the surface of the board 12 can also be measured in accordance with the following method, in addition to the method using the distance sensor unit 14. The first method uses moiré fringes. As shown in FIG. 7, according to this method, a radiation light beam from a point source 41 is projected on the surface of the board 12 through a grating filter 42. The shadow of the grating is projected on the surface of the board 12 by the grating filter 42. Since the surface of the board 12 has unevenness, the shadow has a partially bent grating pattern. When this grating pattern is observed with a CCD camera 43 through the grating filter 42, moiré fringes having a grating pattern with a bent further enlarged by the grating filter 42 are obtained. The three-dimensional shape of the board 12 can be measured from the grating widths of the moiré fringes.

Figure 8:
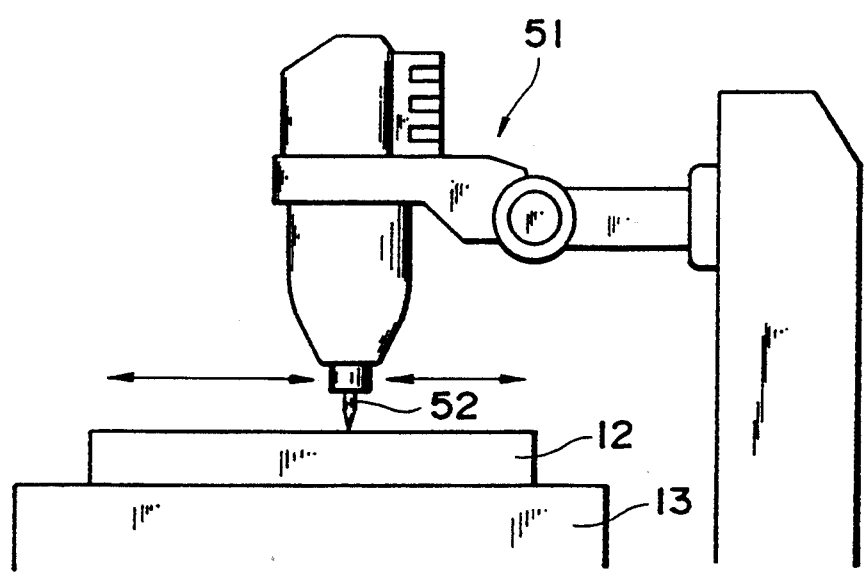
FIG. 8 is a side view showing another method of measuring a three-dimensional shape.

According to another method, the three-dimensional shape is measured by means of mechanical contact. According to this method, a coordinate measuring machine 51 shown in FIG. 8 is used, and the surface of the board 12 is scanned with the feeler on the distal end of the coordinate measuring machine 51, thereby measuring the three-dimensional shape of the board 12. In this case, measurement is performed by using the lower surface of the board 12 in order not to damage the mounting surface.

Figure 9:
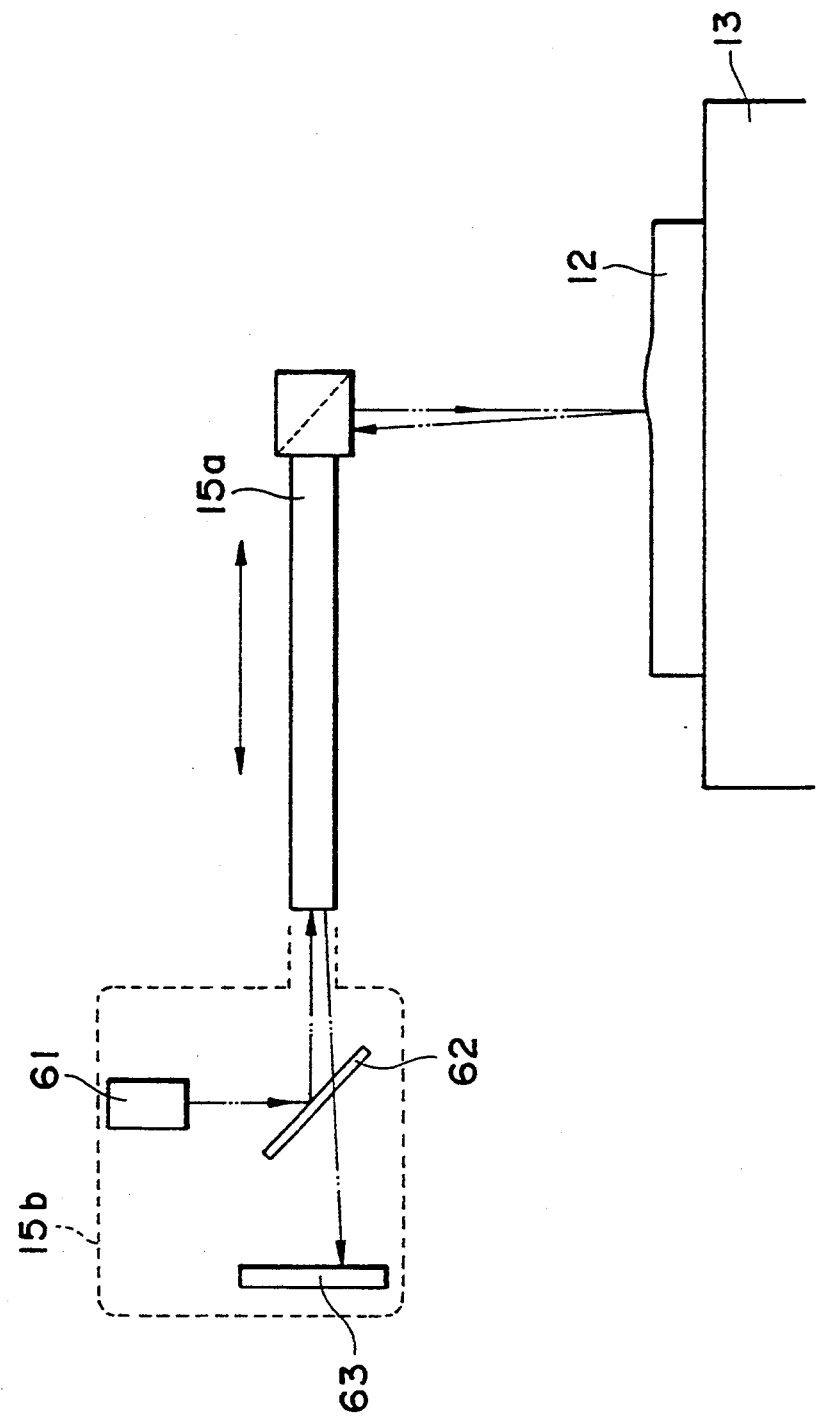
FIG. 9 is a side view showing still another method of measuring a three-dimensional shape.

According to still another method, an inclination amount is measured and integrated. As shown in FIG. 9, according to this method, the parallel degree measuring unit 15 is used to scan the surface of the board 12, thereby measuring the inclination of the entire surface of the board 12. More specifically, the radiation light beam from a light source 61 provided to the measuring portion 15b is reflected by a half mirror 62 and the reflected light beam supplied to the optical probe 15a. This radiation light beam is radiated as the probe light beam from the optical probe 15a to the board 12. The light beam reflected by the board 12 is detected by a semiconductor position detector 63 provided to the measuring portion 15b. When the measurement point of the board 12 is inclined, the reflected light beam is detected at a deviated position. The detection value represents the inclination amount of the board 12, so that the three-dimensional shape of the board 12 can be calculated by integrating the detection value.

The result of measurement obtained by this method is supplied to the controller 16, and the parallel degree between the semiconductor chip 10 and the board 12 is examined. As the result of examination by the controller 16, if it is determined that angle adjustment of the semiconductor chip 10 is needed, necessary commands are sent from the controller 16 to the actuators 11c and 11d of the semiconductor chip mount section 11 to perform necessary angle adjustment. If the controller 16 determines that angle adjustment of the board 12 is needed, necessary commands are sent to the actuators 13c and 13d of the board mount section 13 to perform necessary angle adjustment. As the result of examination by the controller 16, if it is determined that the measurement value of the three-dimensional shape of the board 12 exceeds the allowable value of the flatness, mounting of the semiconductor chip 10 is canceled. Mounting of the semiconductor chip 10 is canceled also when it is determined that the measurement value of an area on which the semiconductor chip 10 is to be mounted, of the measurement values of the board 12, exceeds the allowable value. The allowance of the flatness is preset on the basis of an average of the warp amounts and and the change amounts of the uneven portions of a plurality of boards.

Figure 10:
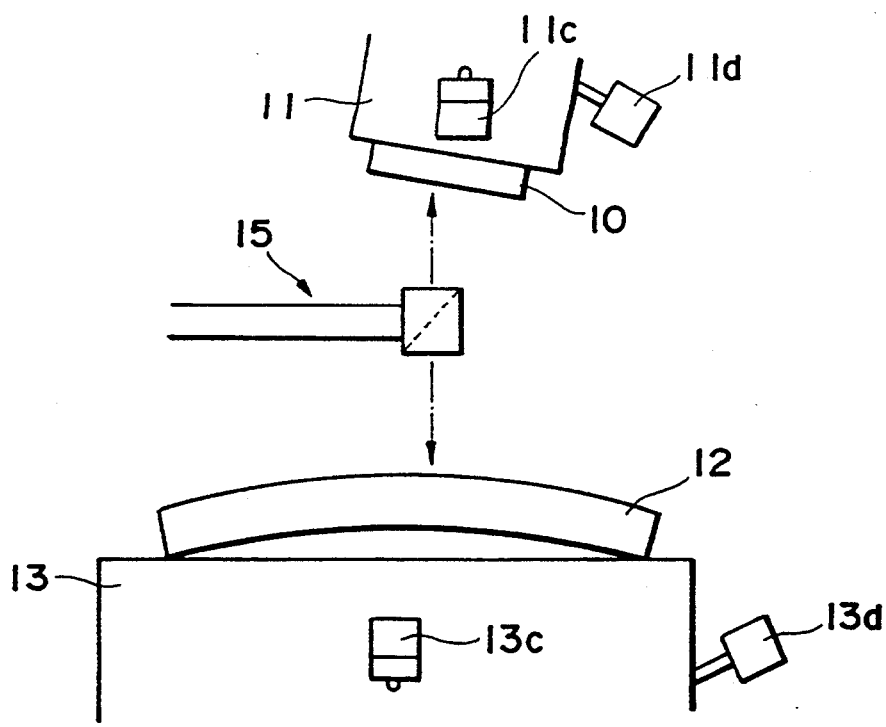
FIGS. 10 and 11 are side and plan views, respectively, showing the first angle adjusting process.
Figure 11:
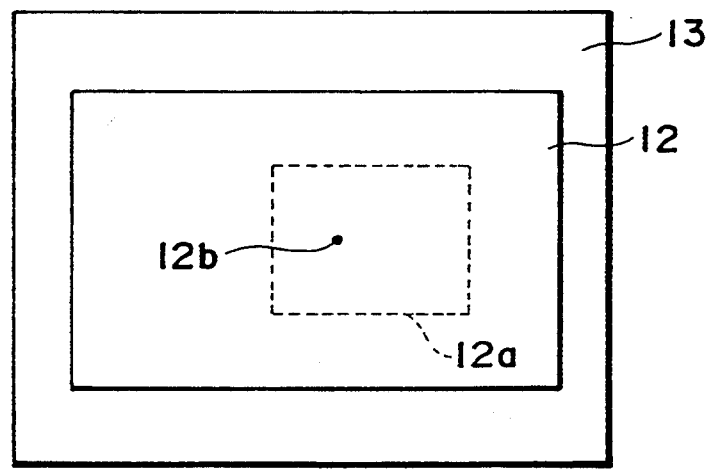

The semiconductor chip 10 and the board 12 can be set parallel to each other by the adjustment described above. If more strict angle adjustment is needed, any one of the following angle adjusting processes may be performed. The first angle adjusting process will be described with reference to FIGS. 10 and 11. According to the first angle adjusting process, a relative angle between an area 12a on the board 12 on which the semiconductor chip 10 is to be mounted and the semiconductor chip 10 is measured at a predetermined measurement point within the area 12a by using the parallel degree measuring unit 15. The measurement value is supplied to the controller 16, and the parallel degree between the semiconductor chip 10 and the board 12 is examined. As the result of this examination, if the controller 16 determines that angle adjustment of the semiconductor chip 10 is needed, necessary commands are sent to the actuators 11c and 11d to perform necessary angle adjustment. If the controller 16 determines that angle adjustment of the board 12 is needed, necessary commands are sent to the actuators 13c and 13d of the board mount section 13 to perform necessary angle adjustment.

Figure 12:
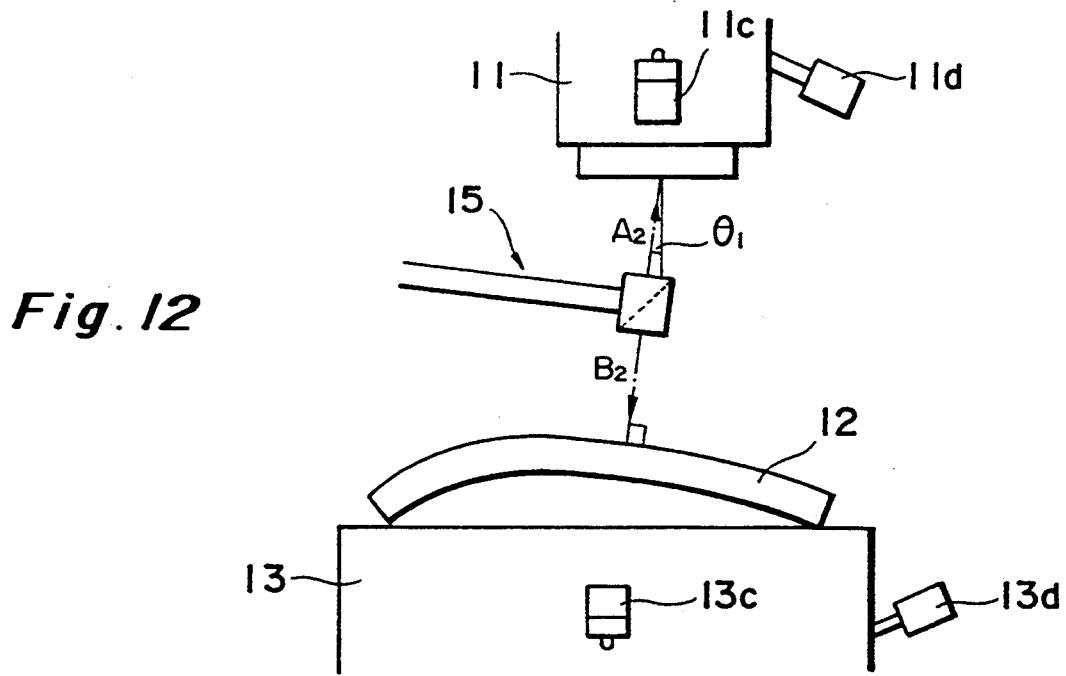
FIGS. 12 and 13 are side views respectively showing the second and third angle adjusting processes.

The second angle adjusting process will be described with reference to FIG. 12. According to the second angle adjusting process, the inclination of the parallel degree measuring unit 15 is adjusted such that the optical axis of the radiation light beam $B_2$ outputted from the parallel degree measuring unit 15 and the surface of the board 12 are perpendicular to each other. An angle $\theta_1$ between the optical axis of the radiation light beam $A_2$ and the surface of the semiconductor chip 10 is measured by using a deviation in exit position of the exit light beam $A_3$. The measurement result is supplied to the controller 16, and the perpendicular degree between the semiconductor chip 10 and the optical axis of the radiation light beam $A_2$ is examined. As the result of this examination, if the controller 16 determines that angle adjustment of the semiconductor chip 10 is needed, necessary commands are sent to the actuators 11c and 11d to perform necessary angle adjustment.

Figure 13:
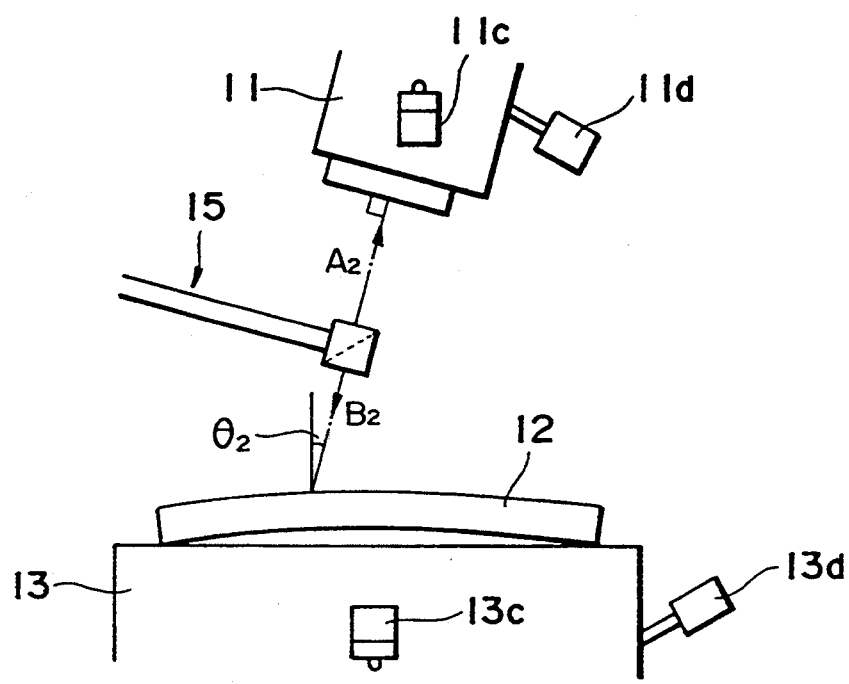

The third angle adjusting process will be described with reference to FIG. 13. According to the third angle adjusting process, the inclination of the parallel degree measuring unit 15 is adjusted such that the optical axis of the radiation light beam $A_2$ outputted from the parallel degree measuring unit 15 and the surface of the semiconductor chip 10 are perpendicular to each other. An angle $\theta_2$ between the optical axis of the radiation light beam $A_2$ outputted from the parallel degree measuring unit 15 and the surface of the board 12 is measured by using a deviation in exit position of the exit light beam $B_3$. The measurement result is supplied to the controller 16, and the perpendicular degree between the board 12 and the optical axis of the radiation light beam $B_2$ is examined. As the result of this examination, if the controller 16 determines that angle adjustment of the board 12 is needed, necessary commands are sent to the actuators 13c and 13d to perform necessary angle adjustment.

Figure 14:
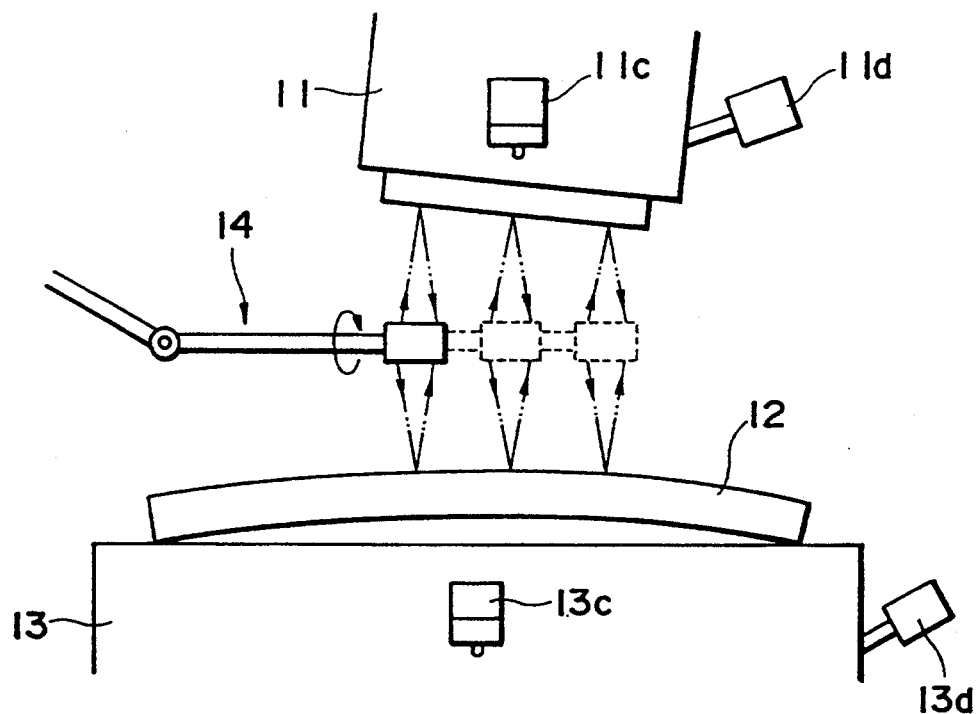
FIGS. 14 and 15 are side and plan views respectively showing the fourth angle adjusting processes.
Figure 15:
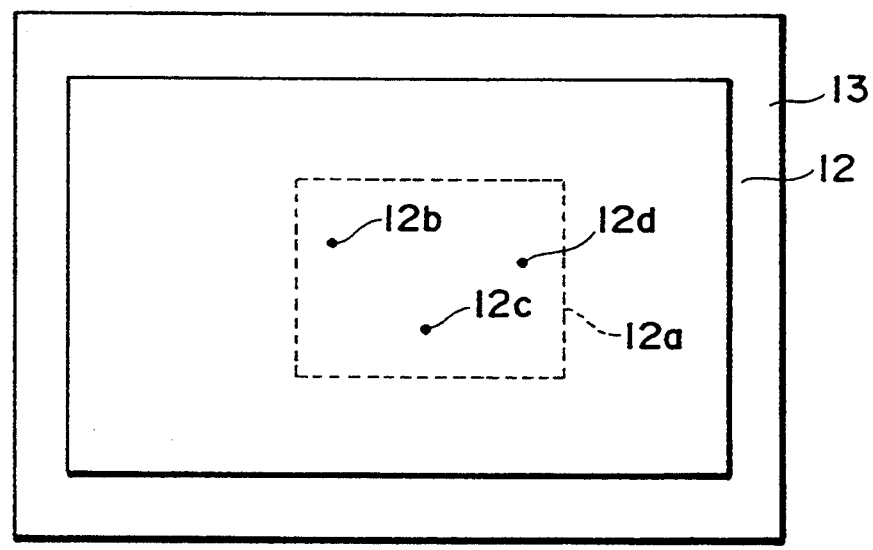

The fourth angle adjusting process will be described with reference to FIGS. 14 and 15. According to the fourth angle adjusting process, the distances between the area 12a on the board 12 on which the semiconductor chip 10 is to be mounted, and the semiconductor chip 10 are measured at predetermined three measurement points 12b to 12d within the area 12a by using the distance sensor unit 14. According to the distance measuring method by the distance sensor unit 14, first, the distance between the distance sensor unit 14 and the board 12 is measured. Then, the distance sensor unit 14 is reversed to face upward, and the distance between the distance sensor unit 14 and the semiconductor chip 10 is measured. The distance between the semiconductor chip 10 and the board 12 is obtained from the sum of the two measured distances. The measurement values at the respective measurement points are supplied to the controller 16, and the parallel degree between the semiconductor chip 10 and the board 12 is examined. As the result of this examination, if the controller 16 determines that angle adjustment of the semiconductor chip 10 is needed, necessary commands are sent to the actuators 11c and 11d to perform necessary angle adjustment. If the controller 16 determines that angle adjustment of the board 12 is needed, necessary commands are sent to the actuators 13c and 13d of the board mount section 13 to perform necessary angle adjustment.

Figure 16:
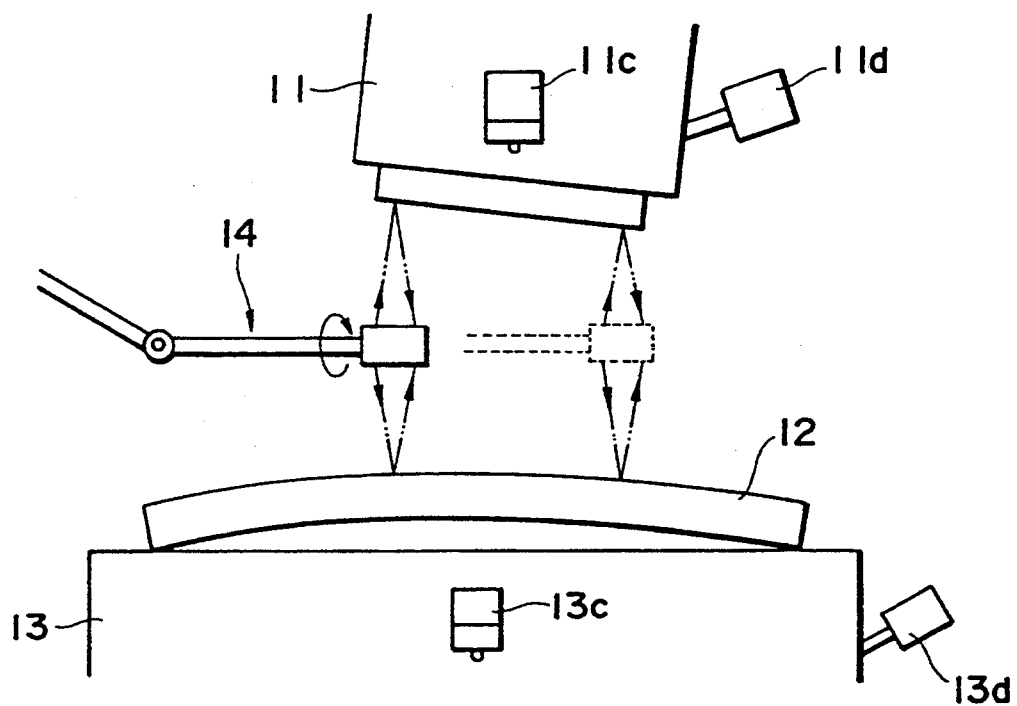
FIGS. 16 and 17 are side and plan views respectively showing the fifth angle adjusting processes.
Figure 17:
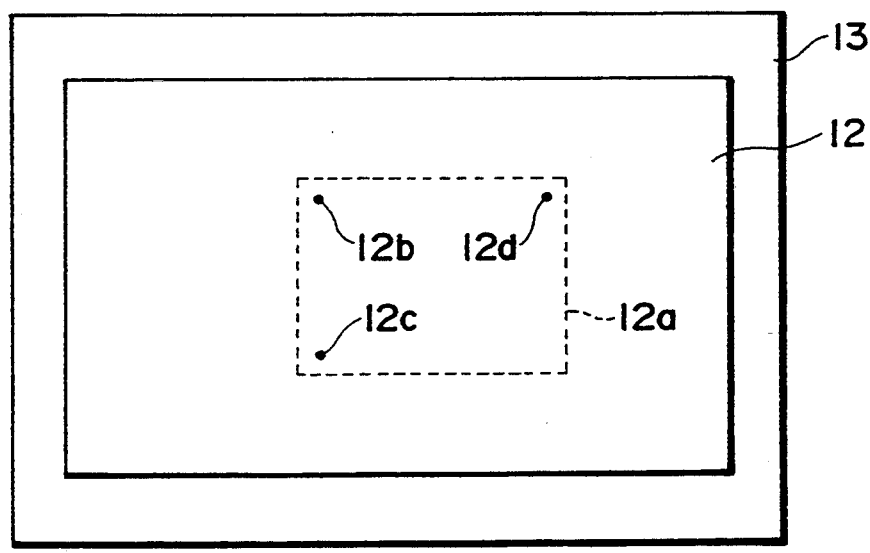

The fifth angle adjusting process will be described with reference to FIGS. 16 and 17. According to the fifth angle adjusting process, the distances between the area 12a on the board 12 on which the semiconductor chip 10 having a rectangular mounting surface, and the semiconductor chip 10 are measured at three measurement points 12b to 12d within the area 12a. As the measurement points 12b to 12d, points close to the predetermined three corners, among four, of the area 12a are selected. The measurement values at the respective measurement points are supplied to the controller 16, and the parallel degree between the semiconductor chip 10 and the board 12 is examined. As the result of this examination, if the controller 16 determines that angle adjustment of the semiconductor chip 10 is needed, necessary commands are sent to the actuators 11c and 11d to perform necessary angle adjustment. If the controller 16 determines that angle adjustment of the board 12 is needed, necessary commands are sent to the actuators 13c and 13d of the board mount section 13 to perform necessary angle adjustment.

When the semiconductor chip 10 and the board 12 are set parallel to each other by the two-stage adjustment described above, a bonding process is performed to mount the semiconductor chip 10 on the board 12. In bonding, the bonding mechanism portion 132 of the board mount section 13 is moved upward to lift the board 12 chucked by the chuck block 131, so that the semiconductor chip 10 chucked by the chuck block 111 of the semiconductor chip mount section 11 and the board 12 are brought into contact with each other. Since the parallel degree between the semiconductor chip 10 and the board 12 is sufficiently maintained, all the bumps formed on the semiconductor chip 10 and pads formed on the board 12 and corresponding to these bumps are brought into contact with each other. In this state, heat is applied the contacting portions to melt all the bumps on the semiconductor chip 10, thereby bonding the bumps with the corresponding pads on the board 12. By this bonding, the semiconductor chip 10 is reliably mounted on the board 12.

In this manner, according to the first embodiment, since the three-dimensional shape of the surface of the board 12 is measured and the parallel degree between the board 12 and the semiconductor chip 10 is adjusted on the basis of the measurement result, all the bumps formed on the semiconductor chip 10 and all the pads formed on the board 12 and corresponding to these bumps can be bonded with each other. Therefore, insufficient contact between the bumps and pads can be prevented, and the yield of mounting can be improved.

The arrangement of a semiconductor chip mounting apparatus according to the second embodiment of the present invention will be described with reference to the schematic diagram of FIG. 18.

Figure 18:
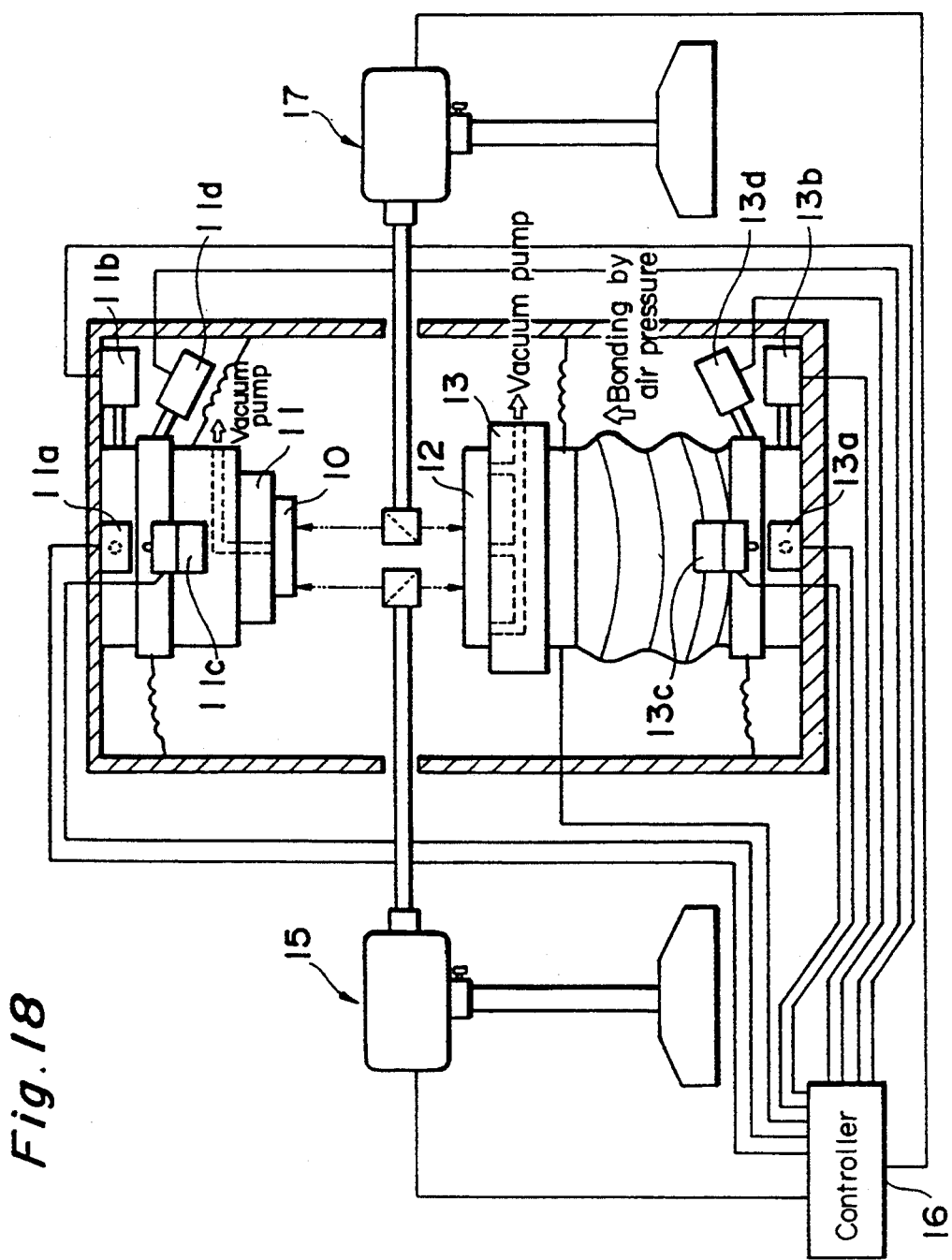
FIG. 18 is a schematic diagram showing the arrangement of a semiconductor chip mounting apparatus according to the second embodiment of the present invention.

Referring to FIG. 18, the semiconductor chip mounting apparatus according to the second embodiment has a semiconductor chip mount section 11 having a lower surface to which a semiconductor chip 10 is mounted by vacuum chucking, a board mount section 13 having an upper surface to which a board 12 is mounted by vacuum chucking, and optical probe units 15 and 17 for measuring the parallel degree between the semiconductor chip 10 and the board 12. Actuators 11a and 11b for performing adjustment in directions parallel to the upper surface of the semiconductor chip 10, and actuators 11c and 11d for performing adjustment of the inclination of the semiconductor chip 10 are provided on the two orthogonal surfaces of side surface portions of the semiconductor chip mount section 11. Actuators 13a and 13b for performing adjustment in directions parallel to the upper surface of the board 12, and actuators 13c and 13d for performing adjustment of the inclination of the board 12 are provided on the two orthogonal surfaces of side surface portions of the semiconductor chip mount section 11. The semiconductor chip mounting apparatus also has a controller 16 for adjusting the parallel degree between the semiconductor chip 10 and the board 12. The controller 16 receives measurement result data supplied from the optical probe units 15 and 17, and outputs necessary commands to the actuators 11a to 11d and 13a to 13d based on the result data.

Figure 19:
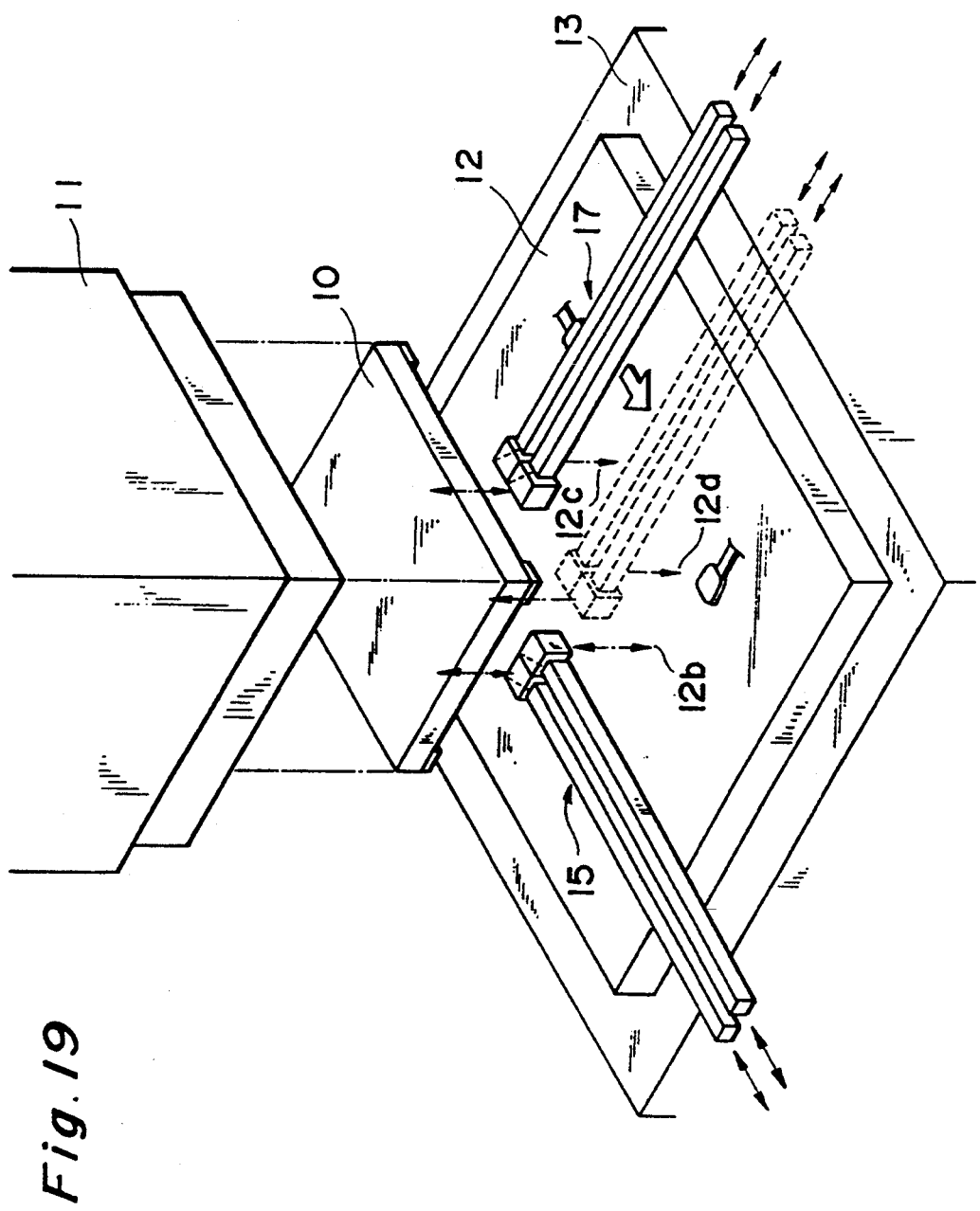
FIG. 19 is a perspective view showing a parallel degree measuring state.

A mounting method using this semiconductor chip mounting apparatus will be described. The semiconductor chip 10 is mounted on the semiconductor chip mount section 11 by chucking, and the board 12 is mounted on the board mount section 13 by chucking. The parallel degrees between the semiconductor chip 10 and the board 12 are measured at a plurality of measurement points by using the optical probe units 15 and 17. This measuring state is shown in the perspective view of FIG. 19. In this embodiment, since the two optical probe units 15 and 17 are used, the parallel degrees can be measured at least at two measurement points 12a and 12b. Furthermore, when the optical probe units 15 and 17 are moved, measurements at three measurement points including the measurement points 12a and 12b and a measurement point 12c can be performed. Measurements may be performed at a plurality of measurement points by moving a single optical probe unit. In this manner, the characteristic feature of this embodiment resides in that the parallel degrees are measured at a plurality of measurement points by using a measuring means, e.g., at least one optical probe unit.

Measurement results obtained by the optical probe units 15 and 17 are supplied to the controller 16, and the parallel degree between the semiconductor chip 10 and the board 12 is examined. As the result of this examination, if the controller 16 determines that angle adjustment of the semiconductor chip 10 is needed, necessary commands are sent to the actuators 11c and 11d of the semiconductor chip mount section 11 to perform necessary angle adjustment. If the controller 16 determines that angle adjustment of the board 12 is needed, necessary commands are sent to the actuators 13c and 13d of the board mount section 13 to perform necessary angle adjustment.

The angle adjusting process by the controller 16 is performed by using either one of the following five different determination methods. These angle adjusting processes will be described with reference to the flow charts of FIGS. 20 to 24.

Figure 20:
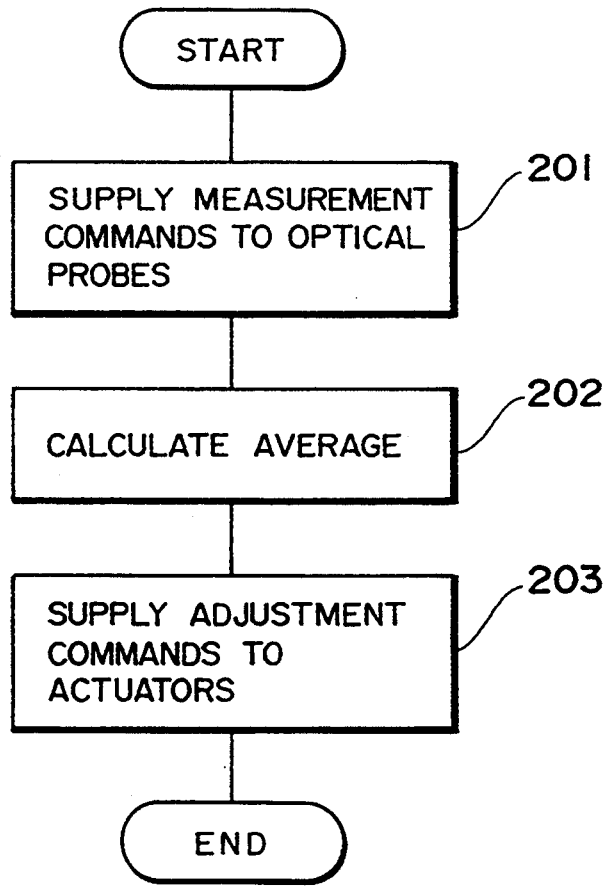
FIG. 20 is a flow chart showing an angle adjusting process using the first determination method.

FIG. 20 shows an angle adjusting process using the first determination method. According to this process, commands are supplied to the optical probe units 15 and 17 to measure the parallel degrees at a plurality of measurement points (step 201). An average of a plurality of measurement values obtained by measurement is calculated (step 202). Necessary angle adjustment commands are supplied to the actuators 11c and 11d or 13c and 13d based on the average.

Figure 21:
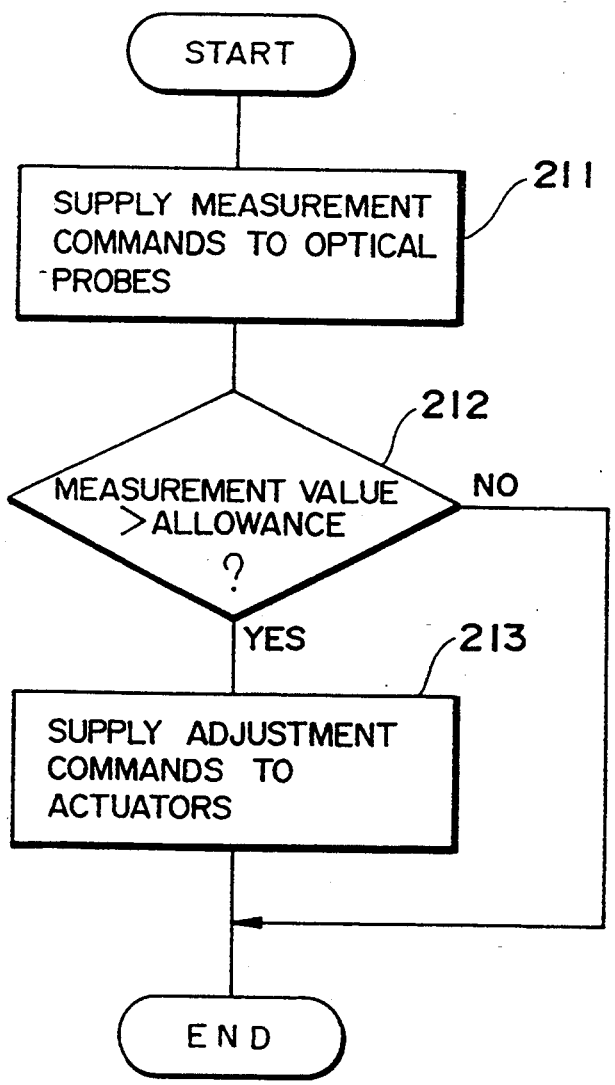
FIG. 21 is a flow chart showing an angle adjusting process using the second determination method.

FIG. 21 shows an angle adjusting process using the second determination method. According to this process, commands are supplied to the optical probe units 15 and 17 to measure the parallel degrees at a plurality of measurement points (step 211). It is determined whether a value larger than a predetermined allowance is present among the plurality of measurement values obtained by measurement (step 212). If it is apparent by this determination that a value larger than the predetermined allowance is present among the measurement values, necessary angle adjustment commands are supplied to the actuators 11c and 11d or 13c and 13d (step 213).

Figure 22:
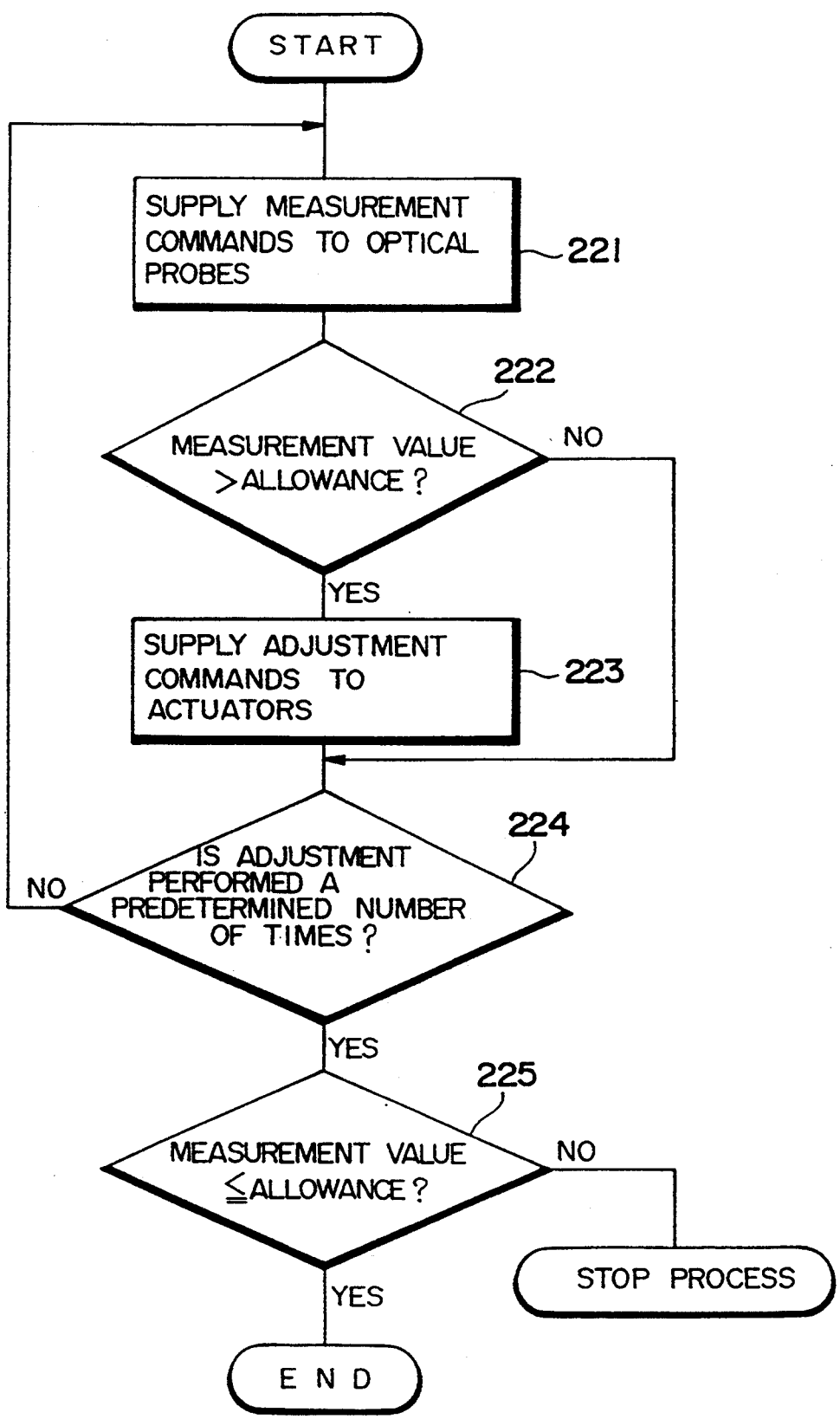
FIG. 22 is a flow chart showing an angle adjusting process using the third determination method.

FIG. 22 shows an angle adjusting process using the third determination method. According to this process, commands are supplied to the optical probe units 15 and 17 to measure the parallel degrees at a plurality of measurement points (step 221). It is determined whether a value larger than a predetermined allowance is present among the plurality of measurement values obtained by measurement (step 222). If it is apparent by this determination that a value larger than the predetermined allowance is present among the measurement values, necessary angle adjustment commands are supplied to the actuators 11c and 11d or 13c and 13d (step 223). The process from step 221 to 223 is repeated a plurality of number of times to continue adjustment (step 224). If all the measurement values do not become equal to the predetermined allowance or less even after adjustment is repeated a plurality of times in this manner, the process is stopped (step 225). If all the measurement values become equal to the predetermined allowance or less, the flow advances to a subsequent process.

Figure 23:
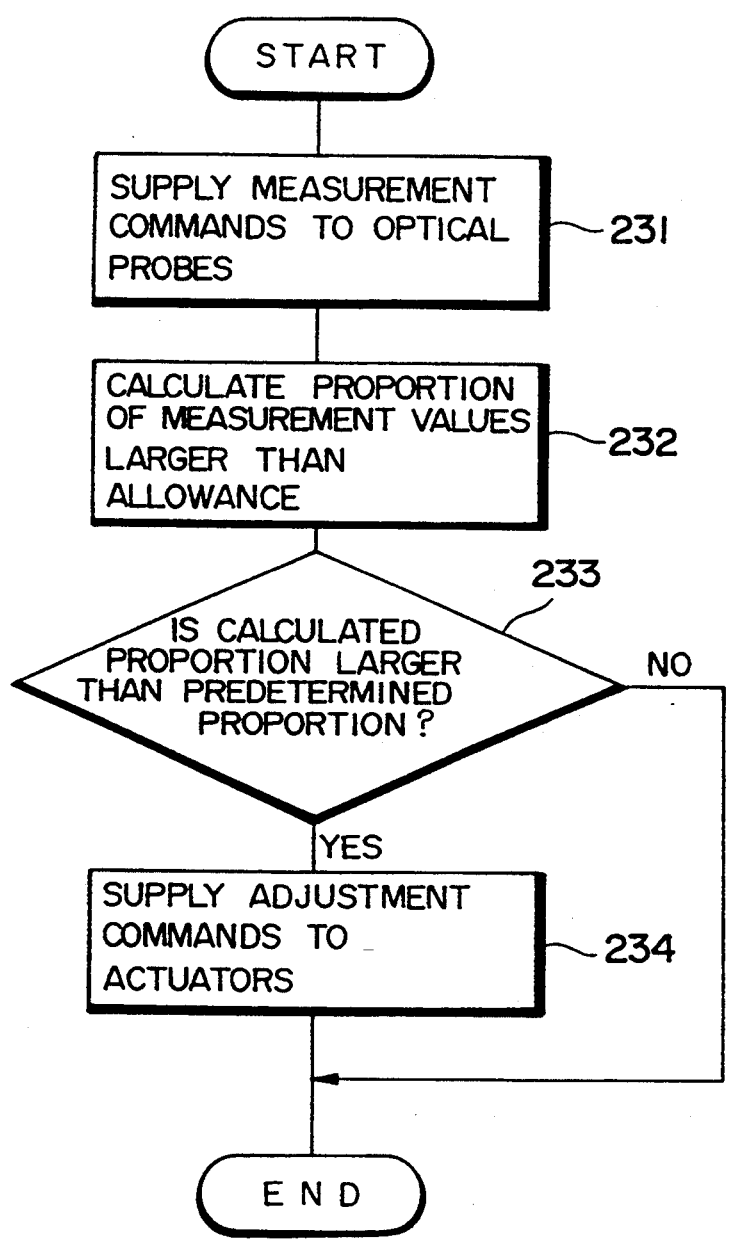
FIG. 23 is a flow chart showing an angle adjusting process using the fourth determination method.

FIG. 23 shows an angle adjusting process using the fourth determination method. According to this process, commands are supplied to the optical probe units 15 and 17 to measure the parallel degrees at a plurality of measurement points (step 231). The proportion occupied by values larger than the predetermined allowance among the plurality of measurement values obtained by measurement is calculated (step 232). If the proportion, obtained by calculation, of values larger than the allowance obtained by calculation exceeds a predetermined proportion (step 233), necessary angle adjustment commands are supplied to the actuators 11c and 11d or 13c and 13d (step 234).

Figure 24:
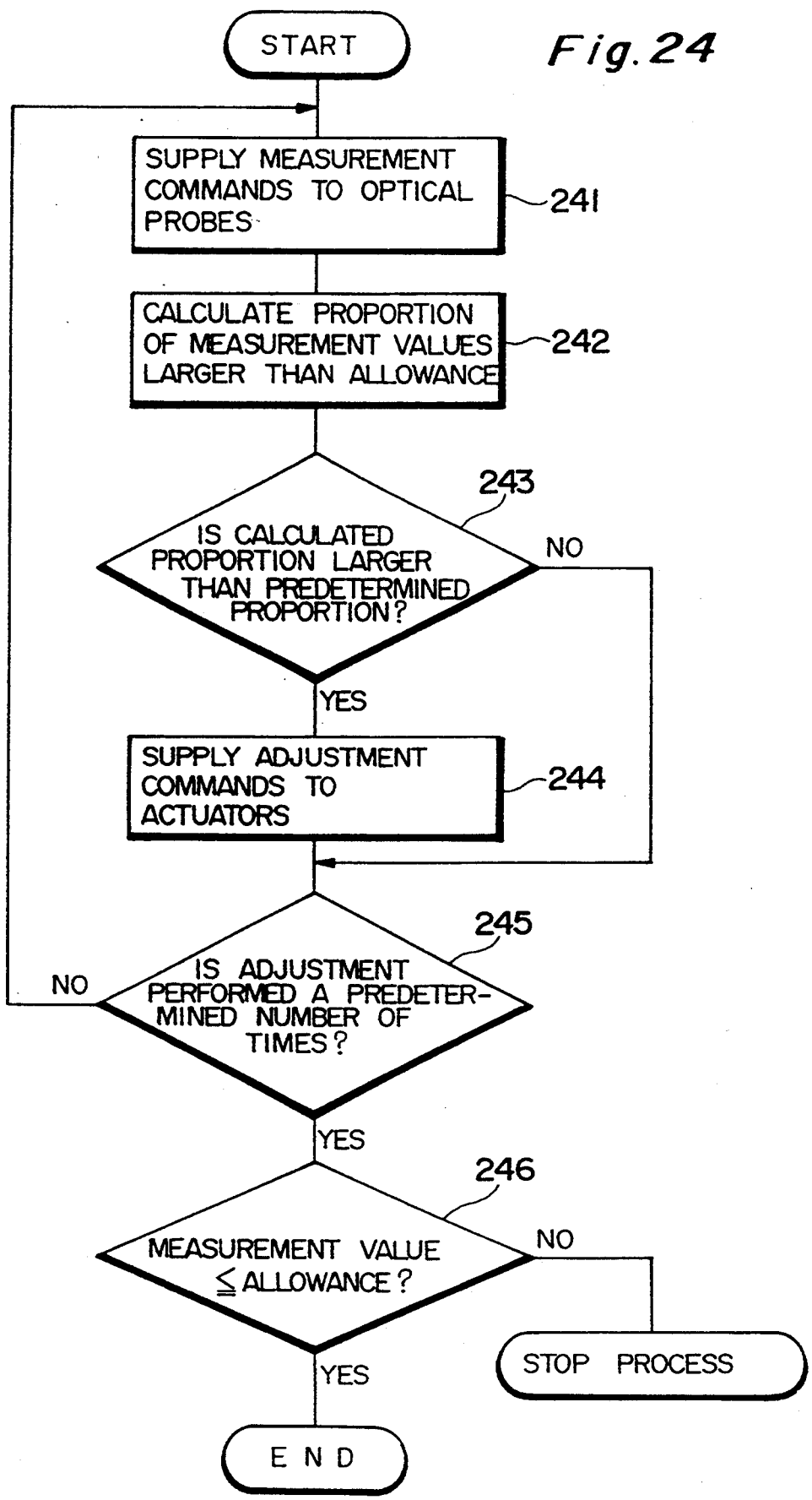
FIG. 24 is a flow chart showing an angle adjusting process using the fifth determination method.

FIG. 24 shows an angle adjusting process using the fifth determination method. According to this process, commands are supplied to the optical probe units 15 and 17 to measure the parallel degrees at a plurality of measurement points (step 241). The proportion occupied by values larger than the predetermined allowance among the plurality of measurement values obtained by measurement is calculated (step 242). If the proportion, obtained by calculation, of values larger than the allowance exceeds a predetermined proportion (step 243), necessary angle adjustment commands are supplied to the actuators 11c and 11d or 13c and 13d (step 244). The process from step 241 to 243 is repeated a plurality of number of times to continue adjustment (step 245). If all the measurement values do not become equal to the predetermined allowance or less even after adjustment is repeated a plurality of times in this manner, the process is stopped (step 246). If all the measurement values become equal to the predetermined allowance or less, the flow advances to a subsequent process.

When the angle adjusting process described above is completed, the optical probe units 15 and 17 are moved backward. The board mount section 13 is lifted, and the semiconductor chip 10 is mounted on the board 12. Since the parallel degree between the semiconductor chip 10 and the board 12 is sufficiently maintained by the preceding angle adjusting process, all bumps 10a on the semiconductor chip 10 can be connected to corresponding pads 12d on the board 12. Therefore, the parallel degree can be sufficiently maintained even when the size of the semiconductor chip 10 and board 12 is increased, and a high mounting yield can be retained.

In this embodiment, the parallel degree is optically measured by using the optical probe units 15 and 17. However, other methods capable of measuring the parallel degree between the semiconductor chip 10 and the board 12 may be used instead. For example, the semiconductor chip 10 and the surface of the board 12 may be scanned with a feeler to measure the parallel degree.

What is claimed is:

1. A method of mounting a semiconductor chip comprising the steps of:
    (a) measuring a three-dimensional shape of a surface of a board on which the chip is to be attached;
    (b) adjusting, based upon the measurement made in step (a), a relative orientation of the board and the chip so that the board and the chip are substantially parallel; and
    (c) attaching the semiconductor chip to the board.

2. A method according to claim 1, further comprising, in between steps (b) and (c), the steps of:
    (b1) measuring a relative angle between the chip and a predetermined measurement point which is within an area in which the chip is to be attached to the board; and
    (b2) adjusting, based upon the measurement made in step (b1), a relative orientation of the board and the chip so that the board and the chip are substantially parallel.

3. A method according to claim 1, further comprising, in between steps (b) and (c), the steps of:
(b1) measuring an angle between a normal to a predetermined measurement point and an attaching surface of the chip which intersects the normal, the predetermined measurement point being within an area in which the chip is to be attached to the board; and
(b2) adjusting, based upon the measurement made in step (b1), a relative orientation of the chip and the normal so that the chip and the normal are substantially perpendicular.

4. A method according to claim 1, further comprising, in between steps (b) and (c), the steps of:
(b1) measuring an angle between a normal to a predetermined measurement point and the surface of the board which intersects the normal, the predetermined measurement point being positioned on an attaching surface of the chip; and
(b2) adjusting, based upon the measurement made in step (b1), a relative orientation of the board and the normal so that the board and the normal are substantially perpendicular.

5. A method according to claim 1, further comprising, in between steps (b) and (c), the steps of:
(b1) measuring distances between the chip and the board at at least three measurement points within an area in which the chip is to be attached to the board; and
(b2) adjusting, based upon the measurement made in step (b1), a relative orientation of the board and the chip so that the board and the chip are substantially parallel.

6. A method according to claim 1, further comprising, in between steps (b) and (c), the steps of:
(b1) measuring distances between the chip and the board at three predetermined measurement points, the three predetermined measurement points being within a rectangular area in which the chip is to be attached to the board and each predetermined measurement point being positioned proximate to a corresponding one of the corners of the rectangular area; and
(b2) adjusting, based upon the measurement made in step (b1), a relative orientation of the board and the chip so that the board and the chip are substantially parallel.

7. A method of mounting a semiconductor chip comprising the steps of:
(a) measuring a three-dimensional shape of a surface of a board on which the chip is to be attached;
(b) adjusting, based upon the measurement made in step (a), a relative orientation of the board and the chip so that the board and the chip are substantially parallel; and
(c) attaching the chip to the board when a degree of flatness of the three-dimensional shape of the surface of the board measured in step (a) is within a predetermined allowance.

8. A method of mounting a semiconductor chip comprising the steps of:
(a) measuring a three-dimensional shape of a surface of a board on which the chip is to be attached;
(b) adjusting, based upon the measurement made in step (a), a relative orientation of the board and the chip so that the board and the chip are substantially parallel; and
(c) attaching the chip to the board when a degree of flatness of the three-dimensional shape of an area in which the chip is to be attached to the board is within a predetermined allowance, the degree of flatness of the three-dimensional shape of the area being based upon the three-dimensional shape of the surface of the board measured in step (a).

9. A method of mounting a semiconductor chip comprising the steps of:
(a) measuring relative angles between the chip and a board, on which the chip is to be attached, at a plurality of measurement points;
(b) adjusting, based upon the measurement made in step (a), a relative orientation of the board and the chip so that the board and the chip are substantially parallel; and
(c) attaching the chip to the board.

10. A method according to claim 9, wherein step (b) comprises the step of adjusting based upon an average of the measurements made in step (a).

11. A method of mounting a semiconductor chip comprising the steps of:
(a) measuring relative angles between the chip and a board, on which the chip is to be attached, at a plurality of measurement points;
(b) adjusting, based upon the measurement made in step (a), a relative orientation of the board and the chip so that the board and the chip are substantially parallel when at least one of the relative angles measured in step (a) is larger than a predetermined allowance; and
(c) attaching the chip to the board.

12. A method of mounting a semiconductor chip comprising the steps of:
(a) measuring relative angles between the chip and a board, on which the chip is to be attached, at a plurality of measurement points;
(b) adjusting, based upon the measurement made in step (a), a relative orientation of the board and the chip so that the board and the chip are substantially parallel when at least one of relative angles measured in step (a) is larger than a predetermined allowance;
(c) repeating steps (a) and (b) until each measured relative angle is less than the predetermined allowance or until steps (a) and (b) have been repeated a predetermined number of times; and
(d) attaching the chip to the board when each measured relative angle is less than the predetermined allowance.

13. A method of mounting a semiconductor chip comprising the steps of:
(a) measuring relative angles between the chip and a board, on which the chip is to be attached, at a plurality of measurement points;
(b) adjusting, based upon the measurement made in step (a), a relative orientation of the board and the chip so that the board and the chip are substantially parallel when a predetermined number of the relative angles measured in step (a) is larger than a predetermined allowance; and
(c) attaching the chip to the board.

14. A method of mounting a semiconductor chip comprising the steps of:
(a) measuring relative angles between the chip and a board, on which the chip is to be attached, at a plurality of measurement points;

(b) adjusting, based upon the measurement made in step (a), a relative orientation of the board and the chip so that the board and the chip are substantially parallel when a predetermined number of the relative angles measured in step (a) is larger than a predetermined allowance;

(c) repeating steps (a) and (b) until each measured relative angle is less than the predetermined allowance or until steps (a) and (b) have been repeated a predetermined number of times; and (d) attaching the chip to the board when each measured relative angle is less than the predetermined allowance.

15. An apparatus for mounting a semiconductor chip comprising:
   measuring means for measuring a three-dimensional shape of a surface of a board on which the chip is to be attached;
   adjusting means for adjusting, based upon the measurement made by the measuring means, a relative orientation of the board and the chip so that the board and the chip are substantially parallel; and
   attaching means for attaching the chip to the board.

16. An apparatus according to claim 15, wherein said measuring means includes means for measuring a relative angle between the chip and a predetermined measurement point, the predetermined measurement point being within an area in which the chip is to be attached to the board.

17. An apparatus according to claim 15:
   wherein the measuring means includes angle measuring means for measuring an angle between a normal to a predetermined measurement point and an attaching surface of the chip which intersects the normal, the predetermined measurement point being within an area in which the chip is to be attached to the board; and
   wherein the adjusting means includes means for adjusting, based upon the measurement made by the angle measuring means, a relative orientation of the chip and the normal so that the chip and the normal are substantially perpendicular.

18. An apparatus according to claim 15:
   wherein the measuring means includes angle measuring means for measuring an angle between a normal to a predetermined measurement point and the surface of the board which intersects the normal, the predetermined measurement point being on an attaching surface of the chip; and
   wherein the adjusting means includes means for adjusting, based upon the measurement made by the angle measuring means, a relative orientation of the board and the normal so that the board and the normal are substantially perpendicular.

19. An apparatus according to claim 15, wherein said measuring means includes means for measuring distances between the chip and the board at at least three measurement points within an area in which the chip is to be attached to the board.

20. An apparatus according to claim 15, wherein said measuring means includes means for measuring distances between the chip and the board at three predetermined measurement points, the predetermined measurement points being within a rectangular area in which the chip is to be attached to the board, each predetermined measurement point being proximate to a corresponding corner of the rectangular area.

21. An apparatus according to any one of claims 15-20, further comprising:
   means for preventing the attaching means from attaching the chip to the board when a degree of flatness of the three-dimensional shape of the surface of the board measured by the measuring means exceeds a predetermined allowance.

22. An apparatus according to any one of claims 15-20 further comprising:
   means for preventing, based upon the three-dimensional shape of the surface of the board measured by the measuring means, the attaching means from attaching the chip to the board when a degree of flatness of the three-dimensional shape of an area in which the chip is to be attached on the board exceeds a predetermined allowance.

23. An apparatus for mounting a semiconductor chip comprising:
   measuring means for measuring relative angles between the chip and a board, on which the chip is to be attached, at a plurality of measurement points;
   adjusting means for adjusting, based upon the measurements made by the measuring means, a relative orientation of the board and the chip so that the board and the chip are substantially parallel; and
   attaching means for attaching the chip to the board.

24. An apparatus according to claim 23, wherein the adjusting means adjusts the relative orientation of the board and the chip on the basis of an average of the relative angles measured by the measuring means.

25. An apparatus according to claim 23, wherein the adjusting means adjusts the relative orientation of the board and the chip when at least one of the relative angles measured by the measuring means is larger than a predetermined allowance.

26. An apparatus according to claim 23:
   wherein the adjusting means adjusts the relative orientation of the board and the chip when at least one of the relative angles measured by the measuring means is larger than a predetermined allowance;
   wherein the attaching means attaches the chip to the board when the relative angles measured by the measuring means are less than or equal to the predetermined allowance; and
   wherein the apparatus further comprises control means for causing the measuring means to repeatedly measure the relative angles between the chip and the board at the plurality of measurement points and for causing the adjusting means to repeatedly adjusts the relative orientation of the board and the chip until each relative angle measured by the measuring means is less than or equal to the predetermined allowance or until the measuring by the measuring means and the adjusting by the adjusting means has been repeated a predetermined number of times, and for preventing the attaching means from attaching the chip to the board when the relative angles are not less than or equal to the predetermined allowance.

27. An apparatus according to claim 23, wherein the adjusting means adjusts the relative orientation of the board and the chip when a predetermined number of the relative angles measured by the measuring means is larger than a predetermined allowance.

28. An apparatus according to claim 23:
   wherein the adjusting means adjusts the relative orientation of the board and the chip when a predetermined number of the relative angles measured by the measuring means is larger than a predetermined allowance;

wherein the attaching means attaches the chip to the board when the relative angles measured by the measuring means are less than or equal to the predetermined allowance; and wherein the apparatus further comprises control means for causing the measuring means to repeatedly measure the relative angles between the chip and the board at the plurality of measurement points and for causing the adjusting means to repeatedly adjusts the relative orientation of the board and the chip until each relative angle measured by the measuring means is less than or equal to the predetermined allowance or until the measuring by the measuring means and the adjusting by the adjusting means has been repeated a predetermined number of times, and for preventing the attaching means from attaching the chip to the board when the relative angles are not less than or equal to the predetermined allowance.

* * * * *